US006300226B1

(12) United States Patent
Miyata et al.

(10) Patent No.: US 6,300,226 B1
(45) Date of Patent: Oct. 9, 2001

(54) FORMED SIC PRODUCT AND MANUFACTURING METHOD THEREOF

(75) Inventors: Tsuguo Miyata, Shizuoka; Akihiro Kuroyanagi, Kanagawa, both of (JP)

(73) Assignees: Tokai Carbon Company, Ltd.; Asahi Glass Company, Ltd., both of Tokyo (JP)

( * ) Notice: Subject to any disclaimer, the term of this patent is extended or adjusted under 35 U.S.C. 154(b) by 0 days.

(21) Appl. No.: 09/244,302

(22) Filed: Feb. 3, 1999

(30) Foreign Application Priority Data

Feb. 9, 1998 (JP) .................................................. 10-42906

(51) Int. Cl.[7] .......................... C30B 23/00; H01L 21/20; H01L 21/36
(52) U.S. Cl. .......................... 438/488; 438/931; 423/345
(58) Field of Search .......................... 423/345; 438/488, 438/931

(56) References Cited

U.S. PATENT DOCUMENTS 5,443,649 * 8/1995 Sibley .................................. 118/728
5,604,151 * 2/1997 Goela et al. .......................... 427/162
5,937,316 * 8/1999 Inaba et al. .......................... 438/488
6,153,165 * 11/2000 Tanino .................................. 423/345

* cited by examiner

Primary Examiner—Vu A. Le
Assistant Examiner—Christian D. Wilson

(57) ABSTRACT

A formed SiC product having a low degree of light transmittance useful in a variety of heat resistant components such as equalizing rings, dummy wafers, and other components employed in semiconductor manufacturing facilities, and the manufacturing method thereof. The product is a CVD-formed SiC product prepared by growing a coating on a substrate with a CVD process and thereafter removing the substrate. The product is characterized by having at least one SiC layer with different grain characteristics located either on its surface or within the main structure, and having a light transmittance rate of 0.4% or less for the wavelength range from 300 to 2,500 nm, and 2.5% or less for the wavelength range exceeding 2,500 nm. The method for manufacturing the formed SiC product is characterized by forming at least one SiC layer with different grain characteristics either on its surface or within the main structure provided by changing the CVD reaction conditions.

11 Claims, 4 Drawing Sheets

FORMED SIC PRODUCT AND MANUFACTURING METHOD THEREOF

BACKGROUND OF THE INVENTION

1. Field of the Invention

The present invention relates to a formed SiC product which possesses a high purity, exhibits an excellent heat resistance as well as mechanical strengths and, in particular, exhibits an excellent lack of transparency to light, making it suitable for use in a variety of heat resistant components such as shielding materials, equalizing rings, and others used in heat treatment equipment in semiconductor manufacturing facilities, or in dummy wafers and other components used in diffusion furnaces, etching equipment, CVD equipment, and the like in semiconductor manufacturing facilities. The present invention also relates to a method for manufacturing such a formed SiC product.

2. Description of the Background Art

Silicon carbide (SiC) possesses excellent material characteristics such as heat resistance, corrosion resistance, and mechanical strength, and therefore is advantageously utilized as a material for various industrial applications. In particular, a formed SiC product manufactured by utilizing a CVD method (i.e. chemical vapor deposition method), hereinafter to be referred to as a "CVD-formed SiC product", is favorably used in application fields where a high purity is required, including use in various components for manufacturing semiconductors, because of its high density and high purity.

Such a CVD-formed SiC product is obtained by causing feed gases to react in the vapor phase to deposit crystal grains of SiC on a substrate, causing the crystal grains to grow into a coating, and then removing the substrate. The product is characterized by the possession of high density, a high purity, and a high structural uniformity as a material.

As formed SiC products prepared by a CVD method, chemically deposited, self-supported β-SiC having an attenuation constant of approximately 20 $cm^{-1}$ or less at 3 $\mu m$ and a chemically deposited, self-supported β-SiC having an attenuation constant of approximately 20 $cm^{-1}$ or less at 0.6328 $\mu m$ are proposed in the Japanese Patent Application Laid-Open No. 239609/1994. Whereas a CVD-formed SiC product is known to exhibit a higher degree of light transmittance as its purity increases, the CVD-formed SiC product disclosed in the above-mentioned published patent application was also of very high purity at 100% of a theoretical density, with the metallic impurity content being 5 ppm or less or preferably 3.5 ppm or less.

Because of its light transmittance, however, a CVD-formed SiC product having such a high purity could, depending on the field of application, present certain physical problems when the formed SiC product is used in various components for semiconductor manufacturing facilities such as heat treatment equipment. For instance, in the semiconductor manufacturing process there are certain process steps involving rapid thermal treatment processes (collectively termed as "RTP") such as rapid thermal annealing, rapid thermal cleaning, rapid thermal chemical vapor deposition, rapid thermal oxidation, rapid thermal nitridation, and the like. For these process steps, the use of a formed SiC product as a shielding material has been proposed so that the wafer substrate can maintain characteristics that are excellent in planar uniformity when it is subjected to rapid heating. A formed SiC product tobe used as such a shielding material is required to possess characteristics of being nontransparent to radiated heat rays (Japanese Patent Application Laid-Open No. 237789/1997).

Additionally, while accurate control of a wafer substrate is required in an RTP step, if the temperature is measured with a pyrometer, excessive light transmittance of the components such as those providing support to the wafer substrate causes undesirable disturbance light to interfere with accurate temperature control when a blackbody cavity is formed on the rear of the wafer surface to be thermally treated. To solve this problem, a method of forming the support ring supporting the wafer substrate from silicon or silicon oxide materials, and using a silicon-coated quartz material for a cylinder supporting the support ring so that the cylinder becomes nontransparent within the detecting wavelength range from the pyrometer has been proposed (Japanese Patent Application Laid-Open No. 255800/1996).

Further, to prevent light leaking from the heating element from entering the reflection cavity, a method of arranging a partition as well as a guard ring alongside the wafer, and having such a guard ring comprise a silicon material having a black or gray appearance so that the light leaking from the heating element can be absorbed has been proposed (Japanese Patent Application Laid-Open No. 341905/1994). However, the silicon-made components or silicon-coated components as disclosed in the above-mentioned Japanese Patent Application Laid-Open Nos. 341905/1994 and 255800/1996 have the shortcomings of losing their nontransparency to light due to insufficient corrosion resistance to acid cleaning performed to allow repeated usage and the resulting loss in thickness of the silicon coating.

Moreover, in a plasma etching treatment, the dummy wafer used to stabilize the wafer etching parameters is required to have a low degree of light transmittance. Whereas a dummy wafer is mounted on a carrier boat by operating a transfer robot, since the dummy wafer is identified by illumination by a laser beam, excessive light transmittance of the dummy wafer could obstruct accurate recognition of the wafer position by the robot, making it difficult to mount the dummy wafer at the desired position in the etching equipment.

The crystal form of a CVD-formed SiC product according to the prior art is β type (cubic type) with a yellowish appearance, which presents a certain degree of light transmittance that is difficultto reduce. As a means of reducing the light transmittance, one method for example is to provide a surface roughening treatment so that the light is scattered at the surface thereby reducing light transmittance. According to this method, for example, a mirror-finished material with a surface roughness (Ra) conditioned to 10 nm or less has a light transmittance rate of 40 to 60% when light with a wavelength of 900 nm is applied, whereas a surface-roughened material with the Ra conditioned to 300 to 500 nm presents a light transmittance rate of 0.3 to 0.8% under the same conditions. While this arrangement appears to demonstrate a certain reduction in light transmittance, the method cannot be expected to provide a material with satisfactory nontransparency to light for a wide range of wavelengths.

SUMMARY OF THE INVENTION

After extensive experiments and investigations performed concerning the properties of CVD-formed SiC products and their optical characteristics to obtain a CVD-formed SiC product having excellent nontransparency to light, which could solve the aforementioned problems in the prior art, the present inventors have found that light transmittance can be reduced if a layer that can scatter or reflect light within the material structure of a formed SiC product is provided.

The present invention has been made based on the above findings and, accordingly, an object of the present invention is to provide a formed SiC product comprising high purity β type crystals, such a product having a high purity and excellent heat resistance as well as mechanical strength while at the same time exhibiting excellent nontransparency to light, is suitable for use in various components such as shielding materials, dummy wafers, or others used in semiconductor manufacturing facilities. Another object of the present invention is to provide a method for manufacturing the CVD-formed SiC product having the above-mentioned characteristics.

A formed SiC product in accordance with the present invention for achieving the above-mentioned object is a CVD-formed SiC product prepared via a CVD process, which comprises at least one SiC layer with different grain characteristics located either on its surface or within the main structure, and has a light transmittance rate of 0.4% or less for the wavelength range from 300 to 2,500 nm and 2.5% or less for the wavelength range exceeding 2,500 nm.

A method for manufacturing a formed SiC product in accordance with the present invention comprises, a process for manufacturing a CVD-formed SiC product by growing an SiC coating on the surface of a graphite substrate via a CVD method and thereafter removing the substrate, forming at least one SiC layer with different grain characteristics either on the surface or within the main structure of the CVD-formed SiC product formed on the surface of the graphite substrate by changing the CVD reaction conditions, and then removing the substrate.

Another method for manufacturing a formed SiC product in accordance with the present invention comprises using a CVD- formed SiC product obtained by growing an SiC coating on the surface of a graphite substrate via a CVD method and thereafter removing the substrate, as a substrate, and forming at least one SiC layer with different grain characteristics either on the surface or within the main structure of such a substrate by changing the CVD reaction conditions.

DETAILED DESCRIPTION OF THE INVENTION AND PREFERRED EMBODIMENTS

Figure 1:
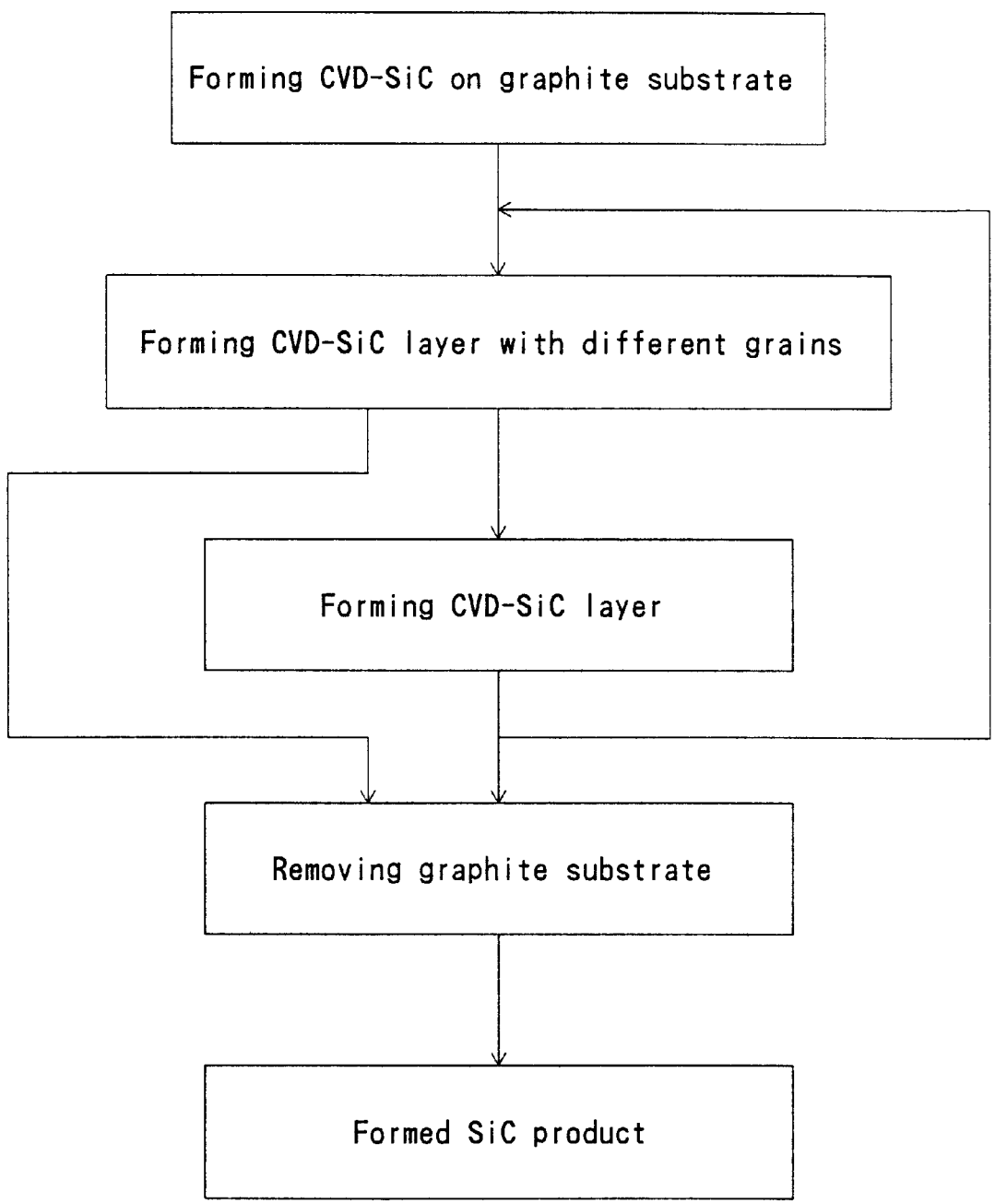
FIG. 1 is a schematic flow chart describing a method of for manufacturing a formed SiC product in accordance with the present invention.

A formed SiC product according to the present invention is a CVD-formed SiC product prepared by first depositing an SiC coating on a substrate via a CVD method, then removing the substrate, and having at least one SiC layer with different grain characteristics formed either at its surface or within the structure of the formed SiC product.

During the process in which SiC is deposited on the surface of a substrate and an SiC coating is formed, the feed gases first react in the vapor phase to generate kernels of SiC on the substrate surface. The kernels then grow into amorphous SiC which, via the formation of fine polycrystalline SiC grains, in turn grow further into a crystalline structure having a columnar arrangement to form an SiC coating. Therefore, various characteristics of a CVD-formed SiC product such as mechanical strength, thermal properties, optical properties, and the like differ, depending on the grain characteristics of the SiC coating deposited and formed on the surface of a substrate.

For instance, when light passes from an SiC layer having a larger mean grain diameter to one having a smaller mean grain diameter, complex reactions of light such as scattering, refraction, reflection, and others occur at the boundary surface to reduce the light transmittance properties. Similarly, when light passes from an SiC layer having a smaller mean grain diameter to one having a larger mean grain diameter, the light transmittance properties decline because of the same reasons.

A formed SiC product in the present invention attains a low degree of light transmittance by providing at least one such SiC layer with different grain characteristics located either on its surface or within the structure of the formed SiC product, thereby modifying the optical characteristics by causing scattering, refraction, reflection, and the like. In other words, providing an SiC layer having different grain characteristics causes disorders in the crystalline arrangement to reduce the light transmittance rate.

Specifically, the present invention provides a formed SiC product exhibiting a low light transmittance rate across the visible light range and infrared light range by attaining a light transmittance rate of 0.4% or less for the wavelength range from 300 to 2,500 nm, and 2.5% or less for the wavelength range exceeding 2,500 nm.

As the substrate on which an SiC coating is to be grown after depositing SiC by a CVD process for preparing a formed SiC product according to the present invention, carbon-based materials and, particularly, graphite materials are preferred as they can be easily burned off by using a thermal treatment in air. Further, as a graphite substrate, a high purity material having a high degree of flatness containing as low an amount of impurities as practically achievable is preferred. For removing a graphite substrate after growing an SiC coating, several methods are available including removal of the graphite substrate by machining, removal by grinding, by heating in air and burning off, or any appropriate combination of these methods. Among the aforementioned methods, however, the method of burning off the substrate is preferred for operational simplicity.

A CVD-formed SiC product is manufactured by coating an SiC layer after depositing SiC on the surface of a graphite substrate with a CVD process, and subsequently growing the SiC coating and then removing the graphite substrate. Formation of an SiC coating is obtained by the following procedures. A graphite substrate is set in place in a CVD reaction unit of which the system is substituted with a normal pressure hydrogen atmosphere by evacuating the air, heating, and then feeding hydrogen gas. Subsequently, using hydrogen gas as a carrier gas, halogenated organic silicon compounds such as trichloromethysilane, trichloromethysilane, dichlorodimethylsilane, dichlorodimethylsilane, and the like are fed into the system as feed gases, thereby causing vapor phase thermal decomposition reactions to deposit SiC on the surface of the graphite substrate and coat it with an SiC layer.

During the process in which an SiC coating is grown, the feed gases first react in the vapor phase to generate kernels of SiC on the surface of a graphite substrate. The SiC kernels then grow into amorphous SiC, which gradually grows into fine polycrystalline SiC grains. By continuing the CVD reactions, the fine polycrystalline SiC grains grow further into a crystalline structure having a columnar arrangement to form an SiC coating. Therefore, since the SiC coating thus formed comprises SiC grains having a crystalline structure with a columnar arrangement, the various characteristics of a CVD-formed SiC product such as mechanical strength, thermal properties, optical properties, and the like differ, depending on the characteristics of the SiC grains.

Characteristics of such SiC grains forming the SiC coating can be altered by changing the CVD reaction conditions. More specifically, for example, SiC coatings comprising SiC grains of differing characteristics can be deposited by appropriately changing the conditions such as the mixing ratios of halogenated organic silicon compounds as the feed gases and hydrogen gas as the reducing agent, the feed gas flow rate, temperatures or time duration for the CVD reactions, the pressure at the CVD reaction unit, and others.

To form at least one SiC layer with different grain characteristics on the surface or within the main structure of the CVD-formed SiC product, settings for the CVD reaction conditions such as mentioned above can be changed as appropriate during the process in which an SiC coating is grown. For example, as illustratively shown in FIG. 1, by first performing a CVD reaction for a desired time duration under the required CVD reaction conditions to form an SiC coating of the intended CVD-formed SiC product, then performing a CVD reaction under a reduced reaction temperature for a certain time duration, followed by another CVD reaction under the original conditions, an SiC layer having different grain characteristics wherein a mean grain size which is smaller is formed within the CVD-formed SiC product. Thereafter, a formed SiC product according to the present invention can be prepared by removing the graphite substrate. Manufacturing of formed SiC products having two or more SiC layers with different grain characteristics is also possible by applying similar procedures repeatedly.

Figure 2:
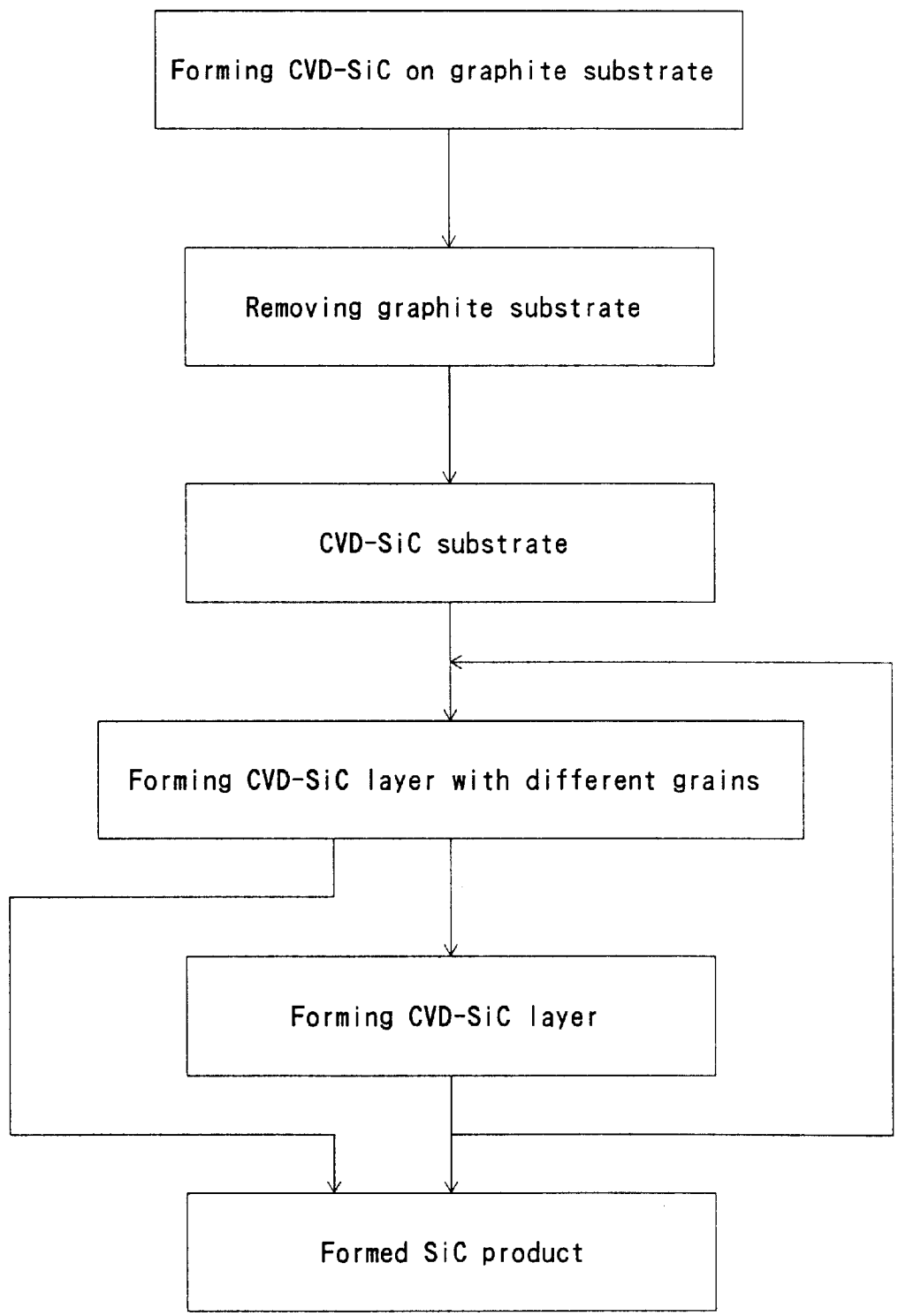
FIG. 2 is a schematic flow chart describing another method for manufacturing a formed SiC product in accordance with the present invention.

Alternatively, as illustratively shown in FIG. 2, a formed SiC product according to the present invention can also be prepared in a different manner as follows. First an SiC layer is formed on the surface of a graphite substrate by a CVD reaction, which is performed for a desired time duration under the required CVD reaction conditions that could form an SiC coating of the intended CVD-formed SiC product. Subsequently, the graphite substrate is removed, and using the CVD-formed SiC product thus obtained as a substrate, a CVD reaction is performed under a different reaction temperature to form an SIC layer having a different mean grain size.

The formed SiC products thus manufactured exhibit characteristics such as a density of 3.2 g/cm$^3$ or more, thermal conductivity of 220 W/mK or more, and a thermal expansion coefficient between 3.5 and 4.2×10$^{-6}$/K (from room temperatures to 1,000° C.). They are stable, even after being irradiated by a high-energy light, and contain an extremely low amount of metallic impurities such as 1×10$^{10}$ atom/cm$^2$ or less as measured by a total reflection X-ray fluorescence analysis. Accordingly, such formed SiC products exhibit a high purity and low light transmittance properties, in addition to having an excellent thermal resistance or mechanical strength.

EXAMPLES

This invention is explained in more detail below referring to Examples and a Comparative Example:

Example 1

A substrate was prepared by machining an isotropic graphite material having a bulk density of 1.8 g/cm$^3$, thermal expansion coefficient of 3.9×10$^{-5}$/K, and ash content of 20 ppm, into a disc of 202 mm in diameter and 5 mm in thickness. The graphite substrate was then placed inside a quartz reaction chamber of a CVD reactor. After replacing the atmosphere with hydrogen gas, a gas mixture comprising trichloromethysilane as the feed gas and hydrogen as the carrier gas was fed into the reaction chamber at a rate of 190 liters/min., with the trichloromethysilane content in the gas mixture set to 7.5% by volume. The CVD reaction was carried out for 12 hours at a reaction temperature of 1,400° C., then for one hour at a lower reaction temperature of 1,100° C., to form an SiC coating having a mean grain diameter of 1.5 $\mu$m, followed by one more CVD reaction performed for 12 hours with the reaction temperature again at 1,400° C. to complete the formation of the SiC coating. Subsequently, the graphite substrate was burned off by heating in air, and the resultant product was smoothed by grinding to obtain a disc-shaped formed SiC product 200 mm in diameter and 0.5 mm in thickness.

Example 2

A formed SiC product was prepared in the same manner as in Example 1, except that the CVD reaction was carried out for 12 hours at a reaction temperature of 1,400° C., for one hour at a lower reaction temperature of 1,200° C., to form an SiC coating having a mean grain diameter of 2.1 $\mu$m, then 7 hours with the reaction temperature again at 1,400° C., for one hour at 1,200° C., and for 8 hours at the original 1,400° C., thereby completing the formation of the SiC coating.

Example 3

A formed SiC product was prepared in the same manner as in Example 1, except that the CVD reaction was carried out for 24 hours at a reaction temperature of 1,400° C., then for one hour at a lower reaction temperature of 1,100° C.

Comparative Example

A formed SiC product was prepared in the same manner as in Example 1, except that the CVD reaction was carried out for 25 hours at a reaction temperature set at 1,400° C. to grow an SiC coating having a mean grain diameter of 8 $\mu$m on a graphite substrate.

Figure 3:
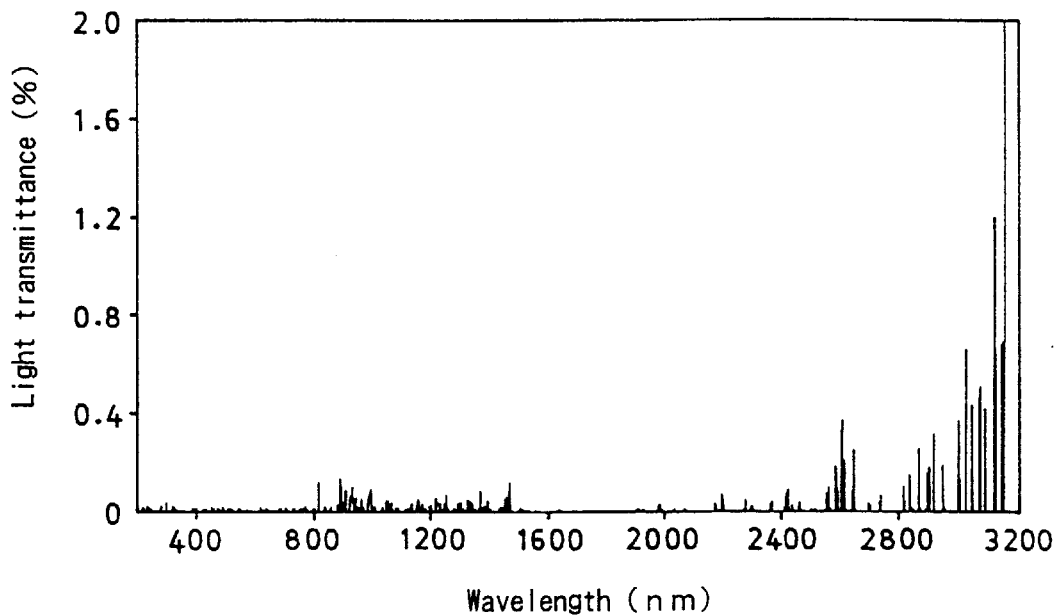
FIG. 3 is a graph that shows the relationship between the light wavelength and the light transmittance rate of Example 2.
Figure 4:
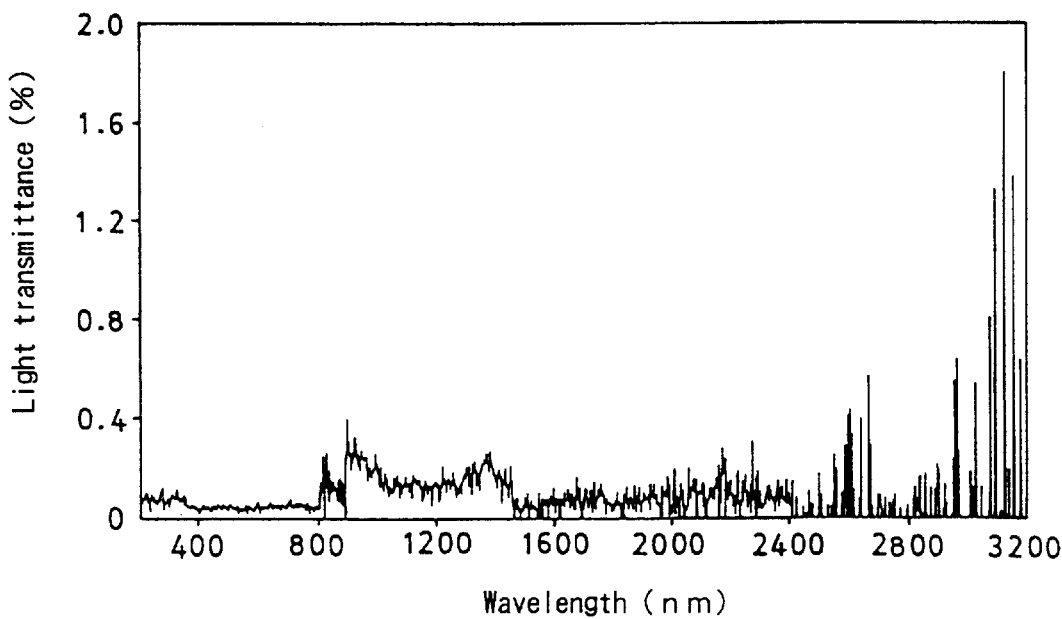
FIG. 4 is a graph that shows the relationship between the light wavelength and the light transmittance rate of Example 3.
Figure 5:
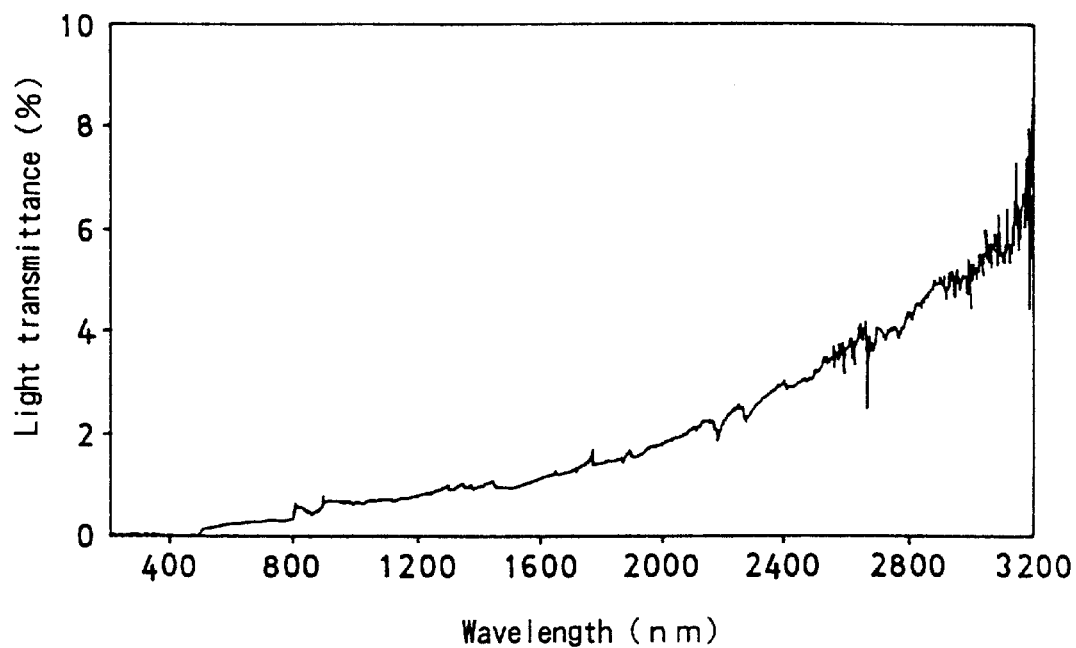
FIG. 5 is a graph that shows the relationship between the light wavelength and the light transmittance rate of a comparative example.

The formed SiC products thus prepared in Examples 1 through 3 as well as in the Comparative Example as above were measured for light transmittance by using an automatic recording spectrophotometer made by Shimadzu Corporation. The results are shown in Table 1 and FIGS. 3 through 5, together with a summary of the CVD growth conditions for the SiC coatings.

TABLE 1

|  |  | Example 1 | Example 2 | Example 3 | Comparative Example |
|---|---|---|---|---|---|
| CVD reaction conditions | Temperature (° C.) × Time (hr) | 1,400 × 12 | 1,400 × 8 | 1,400 × 24 | 1,400 × 25 |
|  | Temperature (° C.) × Time (hr) | 1,100 × 1 | 1,200 × 1 | 1,100 × 1 | — |
|  | Temperature (° C.) × Time (hr) | 1,400 × 12 | 1,400 × 7 | — | — |
|  | Temperature (° C.) × Time (hr) | — | 1,200 × 1 | — | — |
|  | Temperature (° C.) × Time (hr) | — | 1,400 × 8 | — | — |
| Light transmittance (%) | Wavelength: 300 to 2,500 nm | 0.4 | 0.1 | 0.4 | 3.0 |
|  | Wavelength: 2,500 to 3,200 nm | 1.8 | 2.0 | 1.8 | 8.5 |

From the results summarized in Table 1, it can be seen that for the CVD-formed SiC products of Examples 1 through 3, wherein at least one SiC layer having different grain characteristics is formed either on the surface or within the main structure of the SiC product, light transmittance rates are lower than that of the comparative example across the visible light range and infrared light range, as demonstrated by the light transmittance rate of 0.1 to 0.4% attained for the wavelength range from 300 to 2,500 nm, and 1.8 to 2.0% for the wavelength range from 2,500 to 3,200 nm.

As described above, in accordance with the present invention, a formed SiC product possessing a high density and high purity, together with excellent nontransparency to light as well as heat resistance and mechanical strength, can be provided because the product has at least one SiC layer having different grain characteristics formed on the surface or within the main structure of such an SiC product to suppress the light transmittance. Also, in accordance with the manufacturing method of the present invention, a formed SiC product having low light transmittance properties can be easily prepared by changing the CVD reaction conditions.

Accordingly, a formed SiC product according to the present invention is extremely useful for application in a variety of heat resistant components such as shielding materials, equalizing rings, and others used in heat treatment equipment in semiconductor manufacturing facilities, or in dummy wafers and other components used in diffusion furnaces, etching equipment, CVD equipment, and the like in semiconductor manufacturing facilities.

What is claimed is:

1. A $\beta$-crystal SiC product formed by chemical vapor deposition and comprising a main SiC structure of $\beta$-crystals having a first mean grain diameter and at least one SiC layer of $\beta$-crystals having a second mean grain diameter different from the first mean grain diameter located either within the main SiC structure or on its surface and having a light transmittance rate of 0.4% or less for a wavelength range of from 300 to 2,500 nm and 2.5% or less for a wavelength range exceeding 2,500 nm.

2. The $\beta$-crystal SiC product of claim 1, wherein the at least one SiC layer is provided within the main SiC structure.

3. The $\beta$-crystal SiC product of claim 1, wherein the at least one SiC layer is provided on the surface of the main SiC structure.

4. In a method for manufacturing a $\beta$-crystal SiC product by growing a main SiC structure of $\beta$-crystals having a first mean grain diameter on the surface of a carbon-based substrate under first chemical vapor deposition reaction conditions, the improvement comprising forming at least one SiC layer of $\beta$-crystals having a second mean grain diameter different from the first mean grain diameter either within the main SiC structure or on its surface under second chemical vapor deposition reaction conditions which are different from the first chemical vapor deposition reaction conditions.

5. The method of claim 4, wherein the second chemical vapor deposition reaction is conducted at a lower temperature than the first chemical vapor deposition reaction.

6. The method of claim 4, wherein the at least one SiC layer is formed within the main SiC structure.

7. The method of claim 4, wherein the at least one SiC layer is formed on the surface of the main SiC structure.

8. A method of manufacturing a $\beta$-crystal SiC product comprising the steps of forming a SiC substrate of $\beta$-crystals having a first mean grain diameter under first chemical vapor deposition reaction conditions and forming at least one SiC layer of $\beta$-crystals having a second mean grain diameter different from the first mean grain diameter either within the SiC substrate or on its surface under second chemical vapor deposition reaction conditions which are different from the first chemical vapor deposition reaction conditions.

9. The method of claim 8, wherein the second chemical vapor deposition reaction is conducted at a lower temperature than the first chemical vapor deposition reaction.

10. The method of claim 8, wherein the at least one SiC layer is formed within the SiC substrate.

11. The method of claim 8, wherein the at least one SiC layer is formed on the surface of the SiC substrate.

* * * * *